United States Patent [19]

Olney

[11] Patent Number: 5,751,525

[45] Date of Patent: May 12, 1998

[54] EOS/ESD PROTECTION CIRCUIT FOR AN INTEGRATED CIRCUIT WITH OPERATING/TEST VOLTAGES EXCEEDING POWER SUPPLY RAIL VOLTAGES

[75] Inventor: Andrew H. Olney, Burlington, Mass.

[73] Assignee: Analog Devices, Inc., Norwood, Mass.

[21] Appl. No.: 583,612

[22] Filed: Jan. 5, 1996

[51] Int. Cl.[6] .................................................. H02H 9/00
[52] U.S. Cl. .............................. 361/56; 361/111; 361/127
[58] Field of Search ........................ 361/56, 58, 91, 361/111, 117, 118, 119, 127

[56] References Cited

U.S. PATENT DOCUMENTS

| | | | |
|---|---|---|---|
| 3,819,986 | 6/1974 | Fukuoka | 317/16 |
| 4,005,342 | 1/1977 | Davis | 317/16 |
| 4,039,869 | 8/1977 | Goldman | 307/304 |
| 4,061,928 | 12/1977 | Kessler | 307/200 |
| 4,066,918 | 1/1978 | Heuner | 307/304 |
| 4,186,418 | 1/1980 | Seiler | 361/91 |
| 4,288,829 | 9/1981 | Tango | 361/56 |
| 4,366,522 | 12/1982 | Baker | 361/91 |
| 4,385,337 | 5/1983 | Asano | 361/91 |
| 4,400,711 | 8/1983 | Avery | 357/43 |
| 4,408,245 | 10/1983 | Pryor | 361/56 |
| 4,456,940 | 6/1984 | Hammerberg | 361/56 |
| 4,509,067 | 4/1985 | Minami | 357/13 |
| 4,567,500 | 1/1986 | Avery | 357/38 |
| 4,580,063 | 4/1986 | Torelli | 307/200 B |
| 4,605,980 | 8/1986 | Hartranft | 361/56 |
| 4,630,162 | 12/1986 | Bell | 361/56 |
| 4,631,567 | 12/1986 | Kokado | 357/38 |
| 4,633,283 | 12/1986 | Avery | 357/23.13 |
| 4,678,950 | 7/1987 | Mitake | 361/91 |
| 4,692,834 | 9/1987 | Iwahashi | 361/91 |
| 4,698,720 | 10/1987 | Finaurini | 361/91 |
| 4,739,378 | 4/1988 | Ferrari | 357/13 |
| 4,811,155 | 3/1989 | Kuriyama | 361/56 |
| 4,819,047 | 4/1989 | Gilfeather | 357/23.13 |
| 4,829,350 | 5/1989 | Miller | 357/23.13 |
| 4,835,653 | 5/1989 | Zhang | 361/90 |
| 4,839,768 | 6/1989 | Daniele | 361/56 |
| 4,855,620 | 8/1989 | Duvvury | 307/448 |
| 4,858,055 | 8/1989 | Okitaka | 361/91 |
| 4,868,705 | 9/1989 | Shiochi | 361/91 |
| 4,870,530 | 9/1989 | Hurst | 361/91 |
| 4,896,243 | 1/1990 | Chatterjee | 361/56 |
| 4,930,036 | 5/1990 | Sitch | 361/56 |
| 4,939,616 | 7/1990 | Rountree | 361/56 |
| 4,949,212 | 8/1990 | Lenz | 361/56 |
| 4,996,626 | 2/1991 | Say | 361/91 |
| 5,034,845 | 7/1991 | Murakami | 361/56 |
| 5,051,860 | 9/1991 | Lee | 361/58 |
| 5,086,365 | 2/1992 | Lien | 361/58 |
| 5,144,519 | 9/1992 | Chang | 361/58 |
| 5,157,573 | 10/1992 | Lee | 361/56 |
| 5,159,518 | 10/1992 | Roy | 361/56 |
| 5,196,981 | 3/1993 | Kuo | 361/56 |
| 5,200,876 | 4/1993 | Takeda | 361/91 |

(List continued on next page.)

*Primary Examiner*—Fritz Fleming
*Assistant Examiner*—Stephen Jackson
*Attorney, Agent, or Firm*—Wolf, Greenfield & Sacks, P.C.

[57] ABSTRACT

An electrical overstress (EOS) protection circuit for protecting an active circuit of an integrated circuit including first and second clamping circuits series connected between a first input and a first input/output of the EOS protection circuit and third and fourth clamping circuits connected between a first output of the protection circuit and a second input/output. In embodiments of the present invention an EOS protection circuit provides protection for an active circuit while enabling a voltage at an input pad to the active circuit to exceed a power supply reference by more than several volts and to be less than a ground reference by more than several volts.

36 Claims, 7 Drawing Sheets

U.S. PATENT DOCUMENTS

| | | | |
|---|---|---|---|
| 5,208,719 | 5/1993 | Wei | 361/56 |
| 5,218,506 | 6/1993 | Harris | 361/90 |
| 5,237,395 | 8/1993 | Lee | 257/358 |
| 5,239,440 | 8/1993 | Merrill | 361/91 |
| 5,268,588 | 12/1993 | Marum | 257/362 |
| 5,272,586 | 12/1993 | Yen | 361/111 |
| 5,276,582 | 1/1994 | Merrill | 361/111 |
| 5,287,241 | 2/1994 | Puar | 361/56 |
| 5,289,334 | 2/1994 | Ker | 361/56 |
| 5,291,051 | 3/1994 | Hoang | 257/360 |
| 5,291,365 | 3/1994 | Takagi | 361/56 |
| 5,301,084 | 4/1994 | Miller | 361/56 |
| 5,311,391 | 5/1994 | Dungan | 361/56 |
| 5,319,259 | 6/1994 | Merrill | 307/443 |
| 5,333,093 | 7/1994 | Krautschneider | 361/56 |
| 5,335,134 | 8/1994 | Stein et al. | 361/56 |
| 5,343,352 | 8/1994 | Nagamine | 361/56 |
| 5,345,356 | 9/1994 | Pianka | 361/56 |
| 5,359,211 | 10/1994 | Croft | 257/173 |
| 5,392,185 | 2/1995 | Haas, Jr. | 361/56 |
| 5,400,202 | 3/1995 | Metz | 361/56 |
| 5,406,105 | 4/1995 | Lee | 257/355 |
| 5,412,527 | 5/1995 | Husher | 361/56 |
| 5,424,892 | 6/1995 | Topp | 361/18 |
| 5,426,323 | 6/1995 | Reczek | 257/360 |
| 5,430,595 | 7/1995 | Wagner | 361/56 |
| 5,440,162 | 8/1995 | Worley | 257/355 |
| 5,450,267 | 9/1995 | Diaz | 361/56 |
| 5,452,171 | 9/1995 | Metz | 361/56 |
| 5,453,900 | 9/1995 | Feldtkeller | 361/18 |
| 5,455,732 | 10/1995 | Davis | 361/90 |
| 5,463,520 | 10/1995 | Nelson | 361/56 |
| 5,473,500 | 12/1995 | Payne | 361/111 |
| 5,477,413 | 12/1995 | Watt | 361/56 |
| 5,477,414 | 12/1995 | Li | 361/56 |
| 5,479,039 | 12/1995 | Lien | 257/356 |
| 5,495,118 | 2/1996 | Kinoshita | 257/355 |
| 5,521,783 | 5/1996 | Wolfe et al. | 361/56 |
| 5,602,490 | 2/1997 | Olney | 361/56 |

EOS/ESD PROTECTION CIRCUIT FOR AN INTEGRATED CIRCUIT WITH OPERATING/TEST VOLTAGES EXCEEDING POWER SUPPLY RAIL VOLTAGES

BACKGROUND OF THE INVENTION

1. Field of the Invention

The present invention relates generally to integrated circuits, and more particularly, to a method and apparatus for protecting integrated circuits from electrical overstress (EOS) and in particular from electrostatic discharge (ESD).

2. Discussion of the Related Art

Electrical overstress (EOS) of an integrated circuit results from an external source discharging large transient voltages typically over a short period of time onto a terminal or pin of the integrated circuit. EOS events include very fast transients such as electrostatic discharge (ESD), and slower transients produced by powerline glitches or dropouts.

Electrostatic discharge is a well-known cause of failure for integrated circuits. The buildup of electrostatic charge on personnel and equipment during the manufacture and use of integrated circuits may assume potentials as high as 30,000 volts with respect to an ESD reference point. The buildup charge may be discharged through an integrated circuit when either the personnel or the equipment comes in contact with or in close proximity to the integrated circuit. The electrostatic discharge may occur during manufacturing or testing when the integrated circuit is non-operating, or may occur when the integrated circuit is installed in a device and is operating. Integrated circuits are particularly susceptible to ESD damage during handling in a manufacturing or testing environment.

Several test procedures exist for testing integrated circuits and determining sensitivity threshold levels of integrated circuits to electrostatic discharge. These test procedures include: American National Standards Institute (ANSI)/ESD Association Standard S5.1 Human Body Model (HBM) for simulating an ESD event generated by the human body; ANSI/ESD Association Standard S5.2 Machine Model (MM) for simulating an ESD event generated by a charged metal object such as a machine; and ANSI/ESD Association Draft Standard DS5.3 Socketed Charge Device Model (SCDM) for simulating electrostatic discharges to integrated circuits during manufacture and test due to the use of automated equipment. Because of the pervasive use of automated equipment in testing, handling and manufacturing of integrated circuits, SCDM discharges are the predominant cause of manufacturing-related ESD failures.

Integrated circuits containing metal oxide semiconductor (MOS) transistors are particularly sensitive to electrostatic discharge to input and output pins. Several approaches to ESD protection circuits have been developed to protect MOS transistors from ESD events at their input and output pins. These approaches typically rely on diodes, diode-connected bipolar devices having their emitter shorted to their base, or diode-connected MOS devices having their gate directly or resistively connected to their source. These devices are typically used between each Input/Output (I/O) pad of the integrated circuit and one or more voltage reference pads. When properly designed, the prior art protection approaches typically provide adequate protection against EOS/ESD; however, they impose a major design constraint since the use of diodes or diode-connected transistors limits voltages at the I/O pads of the integrated circuit to one or several diode forward voltage drops above or below the voltage of the supply rail to which they are connected.

In prior art systems, PNP punch-through devices have been used to provide EOS/ESD protection and allow voltages at I/O pins to significantly exceed the supply voltage. There are however several disadvantages to using punch-through devices. Punch-through devices typically provide less than two kilovolt ESD protection when tested in accordance with the human body model, and the punch-through threshold voltage of these devices is not sufficiently controllable to provide adequate protection to small geometry CMOS transistors.

Back-to-back, diode-connected transistors have also been used to provide EOS/ESD protection in integrated circuit applications that require a voltage at an I/O pad in excess of a supply voltage. These schemes typically have high turn-on voltages, typically on the order of 35 to 65 volts, making them unsuitable for protecting small geometry (CMOS) transistors. Further, back-to-back, diode-connected transistors are susceptible to latch-up conditions, particularly when used on bipolar-CMOS or CMOS processes, and may act like a silicon controlled rectifier (SCR), staying on with a low holding voltage (approximately 2 volts) even after the overvoltage condition has passed.

Silicon controlled rectifiers (SCR) have also been used to provide EOS/ESD protection in situations where it is desired that a voltage at the I/O pins exceed the supply voltage. As with the back-to-back, diode-connected transistors discussed above, SCRs are also susceptible to latch-up problems. Further, the trigger voltage of an SCR is difficult to monitor and control since SCRs are typically based on non-standard devices.

An object of the present invention is to provide an EOS/ESD protection scheme that can be used on I/O pins having operational voltages that exceed a supply voltage of the integrated circuit and that overcome the limitations of devices used in the prior art.

SUMMARY OF THE INVENTION

According to one embodiment of the present invention an EOS/ESD protection circuit for protecting an active circuit from electrical overstress is provided. The EOS/ESD protection circuit includes first and second clamping circuits connected between a first input and a first signal pad of the electrical overstress protection circuit. The first clamping circuit includes a breakdown device that conducts current in a first direction when a voltage across the breakdown device exceeds a forward conduction threshold. The second clamping circuit includes a breakdown device that in a first direction of current through the breakdown device has an active mode of operation and a breakdown mode of operation. The breakdown mode of operation occurs when a voltage across the breakdown device exceeds a reverse breakdown threshold. The breakdown device switches from the breakdown mode to the active mode when a magnitude of a current through the breakdown device in the first direction exceeds a current threshold level. The electrical overstress protection circuit further includes third and fourth clamping circuits series connected between a first output and a second signal pad of the protection circuit.

In another embodiment of the present invention, each of the breakdown devices of the first and second clamping circuits is a bipolar transistor having a base with a resistance such that when a magnitude of a current through the base region in breakdown mode exceeds a threshold level a voltage is created across the base and switches the bipolar transistor from the breakdown mode to the active mode. In this embodiment, the third and fourth clamping circuits comprise MOS transistors.

In yet another embodiment of the present invention, the third and fourth clamping circuits of the previously described embodiment have a combined breakdown voltage and a first discharge current path is formed from the first input to the first signal pad of the EOS/ESD protection circuit through the third and fourth clamping circuits when a voltage from the first input to the first signal pad exceeds the combined breakdown voltage. The magnitude of the combined breakdown voltage of the third and fourth clamping circuits is less than the magnitude of the sum of the forward conduction threshold of the first clamping circuit and the reverse breakdown threshold of the second clamping circuit.

In accordance with another embodiment of the present invention, an electrical overstress protection circuit for protecting an active circuit from EOS/ESD events includes first and second inputs for receiving first and second reference voltages of the active circuit, first and second outputs for providing the first and second reference voltages to the active circuit, and first and second signal pads for respectively connecting to an external circuit and the active circuit. The protection circuit in accordance with this embodiment further includes first means for protecting the active circuit from an electrical overstress voltage at the first input having one of a positive or negative polarity with respect to the first signal pad. The first means for protecting has an off mode in which the first means for protecting has substantially no effect on the operation of the active circuit, and an on mode in which the first means for protecting limits an absolute value of a voltage at the first output with respect to the second signal pad to less than a predetermined clamping voltage value. The first means for protecting includes switching means for switching from the off mode to the on mode when an absolute voltage value of an electrical overstress voltage at the first input with respect to the first signal pad exceeds a first threshold value that is greater than the first reference value by at least approximately two volts.

In a preferred embodiment, the electrical overstress protection circuit further includes second means for protecting the active circuit from an electrical overstress voltage at the second input having one of a positive or negative polarity with respect to the first signal pad. The second means for protecting has an off mode in which the second means for protecting has substantially no effect on the operation of the active circuit, and an on mode in which the second means for protecting limits an absolute value of a voltage at the second output with respect to the second signal pad to less than the predetermined clamping voltage value. The second means for protecting including switching means for switching from the off mode to the on mode when an absolute value of an electrical overstress voltage at the second input with respect to the first signal pad exceeds a second threshold value that is less than the second reference value by at least approximately two volts.

DESCRIPTION OF THE FIGURES

For a better understanding of the present invention, reference is made to the drawings, which are incorporated herein by reference and in which.

DETAILED DESCRIPTION

Figure 1:
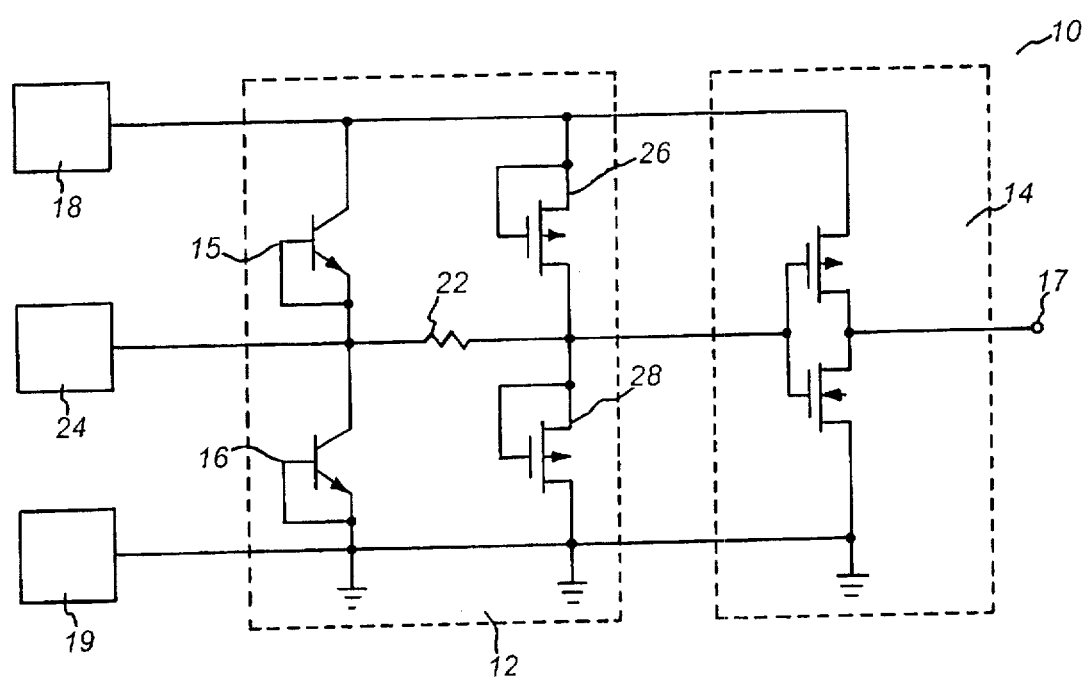
FIG. 1 is a schematic diagram of an integrated circuit including an EOS/ESD protection circuit.

FIG. 1 shows a protection scheme disclosed in co-pending U.S. patent application Ser. No. 08/123,604, assigned to the assignee of this application and incorporated herein by reference. In FIG. 1, an integrated circuit 10 includes an active circuit 14 including one or more transistors, and an ESD protection circuit 12 for protecting the transistors of the active circuit 14. The ESD protection circuit 12 includes two breakdown transistors 15 and 16 respectively coupled between an I/O pad 24 and first and second input reference voltage pads 18 and 19. The first and second input reference voltage pads 18 and 19 are for receiving a supply voltage and a reference voltage (i.e., ground). The ESD protection circuit 12 further includes two PMOS transistors 26 and 28 and a resistor 22. As described further in U.S. patent application Ser. No. 08/123,604, each of transistors 15, 16, 26, and 28 operates as a diode having a reverse breakdown mode in which the transistor conducts current to protect the active circuit 14 from EOS/ESD events. For example, when an EOS/ESD event occurs at pad 24 having a positive voltage with respect to pad 19, and a breakdown threshold of transistor 16 is exceeded, transistor 16 conducts current from pad 24 to pad 19 to prevent harmful voltages from damaging the active circuit 14.

Transistors 15 and 16, in addition to operating in the reverse breakdown mode, may also operate as a diode in a forward conduction mode when a voltage at the common emitter and base exceeds a voltage at the collector by a value greater than a diode voltage drop. This forward conduction voltage is typically approximately 0.6 volts. Therefore, the DC operating voltage at the I/O pad 24 has a specified maximum DC rating of less than approximately 0.6 volts (and typically less than 0.3 volts to provide a safety margin) beyond the supply voltage at the first voltage reference pad 18. If the voltage at the I/O pad exceeds the maximum DC rating, transistors 15 and 16 will conduct DC current and may sustain damage if the DC current is not limited.

In several integrated circuit designs, it is advantageous to allow the voltage at the I/O pins to exceed the voltage at the supply voltage pins by much more than one diode voltage drop. This facilitates special electrical test modes, increases application versatility, and increases robustness of the integrated circuit to harsh environmental conditions such as electrical transients on signal lines and inadvertent battery reversal.

Figure 2:
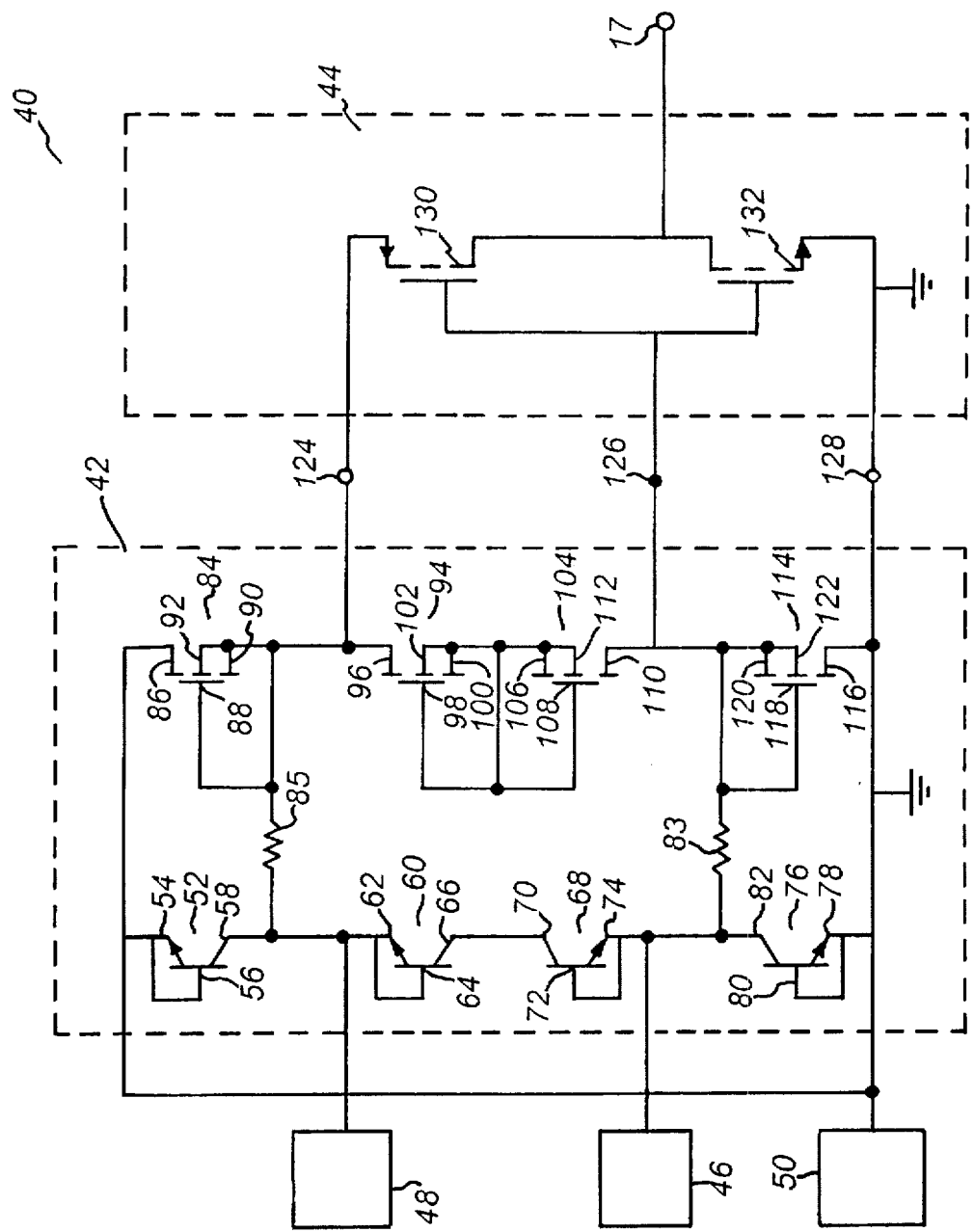
FIG. 2 is a schematic diagram of an integrated circuit including an EOS/ESD protection circuit in accordance with a first embodiment of the present invention.

One embodiment of an EOS/ESD protection circuit for protecting internal devices of an integrated circuit 40 from electrical overstress and electrostatic discharge is shown in FIG. 2. In one mode of operation of the integrated circuit 40, a voltage at an I/O pin may exceed the supply voltage. The integrated circuit 40 includes an EOS/ESD protection circuit 42, an active circuit 44, an I/O pad 46 for connecting to an I/O pin of the integrated circuit 40, a first input reference voltage pad 48 for connecting to a supply voltage, and a second input reference voltage pad 50 for connecting to a ground reference.

The active circuit 44 is connected to the EOS/ESD protection circuit 42 at a first voltage reference node 124, at a second voltage reference node 128 and at an I/O node 126. The active circuit is also coupled to an output 17 of the integrated circuit 40. The active circuit is shown as a PMOS transistor 130 and an NMOS transistor 132 connected as an inverter, but this circuit may include any number of components and is not necessarily limited to CMOS transistors.

The EOS/ESD protection circuit 42 includes four diode-connected, vertical NPN transistors 52, 60, 68 and 76, each having a respective base 56, 64, 72, and 80 connected to a respective emitter 54, 62, 74, and 78. Transistor 52 has its emitter 54 connected to the second input reference voltage pad 50 and its collector 58 connected to the first input reference voltage pad 48. Transistor 60 has its emitter 62 connected to the first input reference voltage pad 46, and its collector 66 connected to the collector 70 of transistor 68. The emitter 74 of transistor 68 is connected to the I/O pad 46. The emitter 78 of transistor 76 is connected to the second input reference voltage pad 50, and the collector 82 of transistor 76 is connected to the I/O pad 46.

The EOS/ESD protection circuit 42 also includes a pair of resistors 83 and 85. Resistor 85 is connected between the first input reference voltage pad 48 and the first voltage reference node 124. Resistor 83 is connected between the I/O pad 46 and the I/O node 126. In a preferred embodiment, the resistors 83 and 85 are formed above the substrate of the integrated circuit 40 by the process of chemical vapor deposition and have a resistance of approximately 153 ohms.

The EOS/ESD protection circuit 42 further includes four diode-connected, enhancement-mode PMOS transistors 84, 94, 104, and 114, each having a respective back gate 92, 102,112, and 122 connected to a respective source 90,100, 106, and 120, and each PMOS transistor also having a respective gate 88, 98, 108, and 118 connected to a respective source 90, 100,106, and 120. Drain 86 of PMOS transistor 84 is connected to the second input reference voltage pad 50, and the source 90 of PMOS transistor 84 is connected to the first voltage reference node 124. Drain 96 of transistor 94 is connected to the first voltage reference node 124, and the source 100 of transistor 94 is connected to the source 106 of transistor 104. Drain 110 of transistor 104 is connected to the I/O node 126. The source 120 of transistor 114 is connected to the I/O node 126 and the drain 122 of transistor 114 is connected to the second input reference voltage pad 50.

Figure 3:
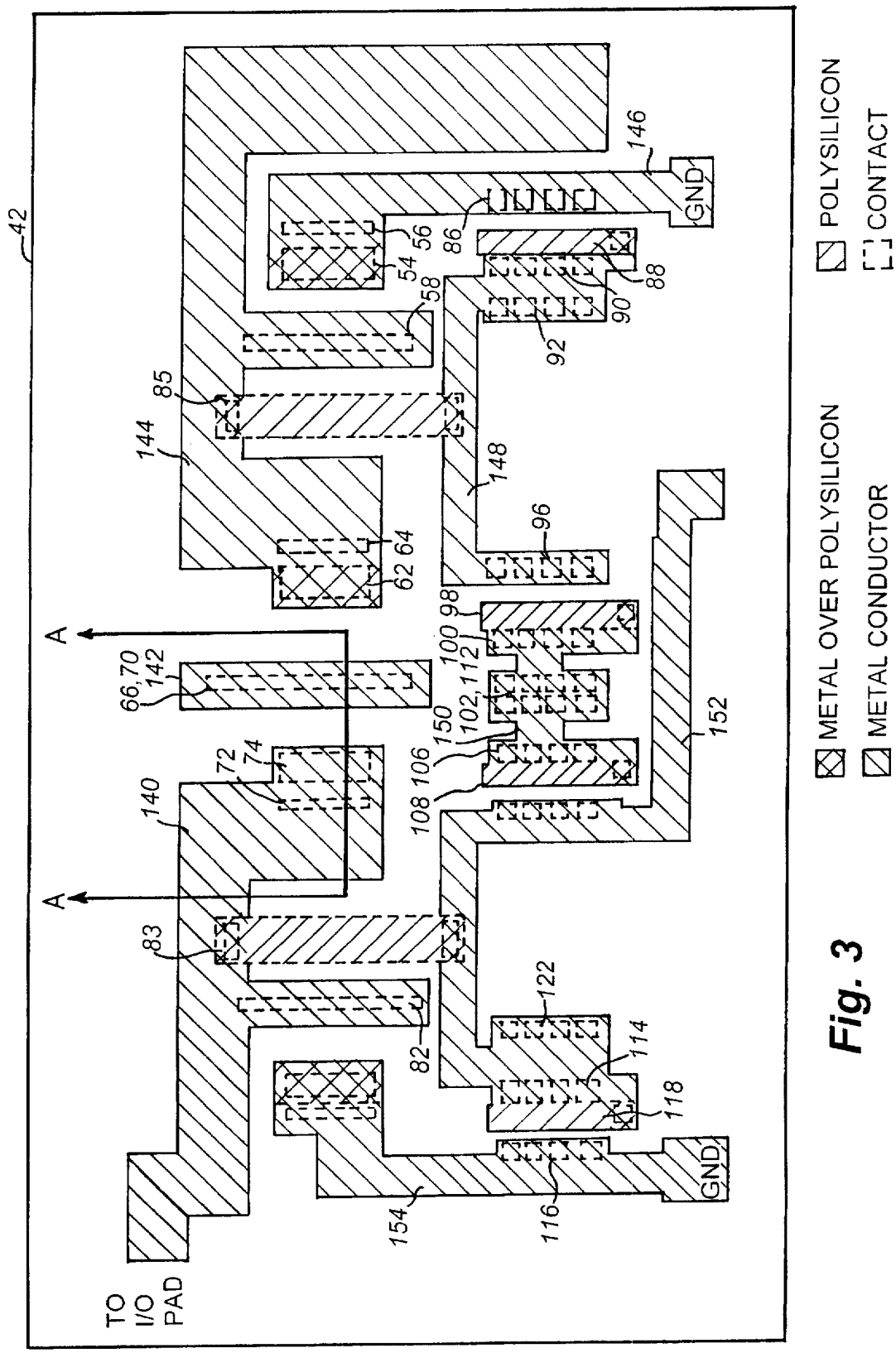
FIG. 3 is a plan view of an EOS/ESD protection circuit in accordance with one embodiment of the present invention.

FIG. 3 shows a plan view of the embodiment of the present invention shown in schematic form in FIG. 2, except that the active circuit 14, diffused layers and dielectric layers are omitted from FIG. 3 for clarity. The components shown in FIG. 3 are connected with various metal conductors 140, 142, 144, 146, 148, 150, 152, and 154 to provide the circuit connections shown in FIG. 2.

Each of the PMOS transistors 84, 94, 104 and 114 of the EOS/ESD protection circuit 42 shown in FIGS. 2 and 3 are substantially identical, with the exception that transistors 94 and 104 are merged (i.e., they share the same back gate (BG)). Each of the PMOS transistors has a gate width of eighteen micrometers (μm) and a gate length of five μm, and the spacing between the drain contact and the gate polysilicon is four μm. Other than the dimensions stated above, the PMOS transistors of the ESD protection circuit 42 are standard PMOS devices.

Figure 4:
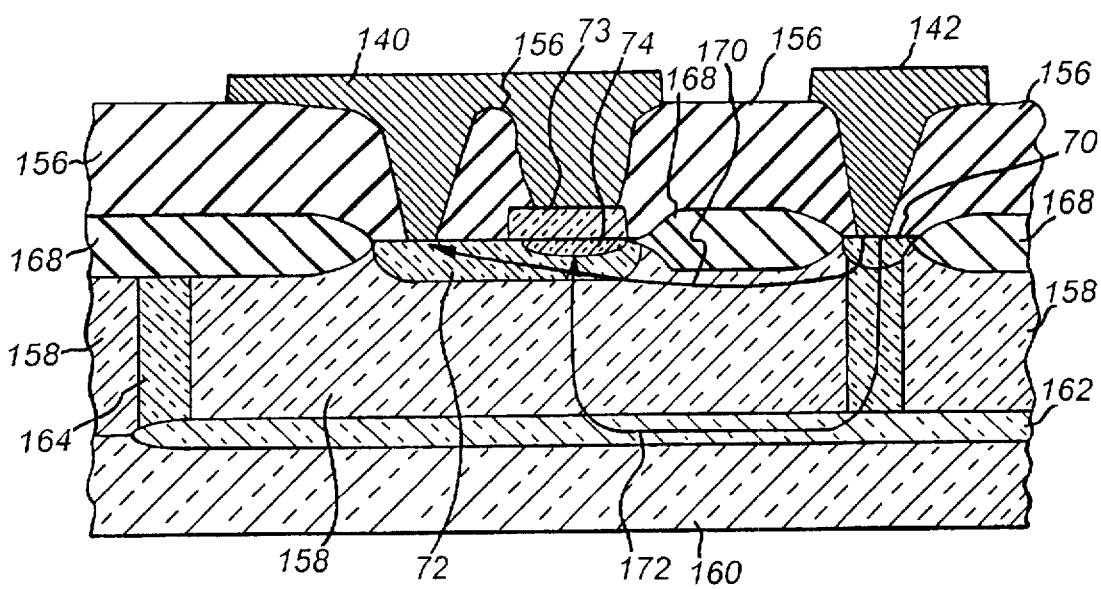
FIG. 4 is a cross-sectional view of FIG. 3 taken along line A—A of FIG. 3.

FIG. 4 shows a cross-sectional side view of transistor 68 taken along line A—A of FIG. 3. For the purpose of a clear illustration, the dimensions of the various junction depths and lateral spacings are not drawn to scale in FIG. 4. As shown in FIG. 4, NPN transistor 68 comprises a semiconductor substrate 160 onto which an epitaxial layer 158 is grown. A buried layer 162 is sandwiched between the substrate 160 and the epitaxial layer 158. Above the epitaxial layer 158 are two diffusion regions or ion implantation layers that form the base 72 and the emitter 74 of the transistor 68. A portion of the base 72 is located directly under the emitter 74. The emitter 74 is below a polysilicon layer 73. This portion of the base under the emitter, due to its limited cross-sectional area, is relatively resistive to current flow in the direction indicated by arrow 170. The collector 70 of transistor 68 merges with buried layer 162 through one of two NPLUGs 164. A dielectric layer 156 and an oxide layer 168 of the integrated circuit 40 are also shown in FIG. 4 along with metal conductors 140 and 142.

Each of diode-connected, vertical NPN transistors 52, 60, 68 and 76 is substantially identical, except that transistors 60 and 68 are merged (i.e., they share the same collector as shown in FIG. 3). Each of transistors 52, 60, 68 and 76 has a collector-emitter-base layout and has its respective emitter shorted to its base by metalization to provide the diode connection. In a preferred embodiment of the present invention, as shown in FIGS. 3 and 4, each of the NPN transistors is substantially a standard transistor except that the emitter area is 5 μm by 20 μm, the NPLUG to base spacing is greater than or equal to 15 μm and the spacing between the base and emitter contacts is greater than or equal to 6 μm.

Figure 5:
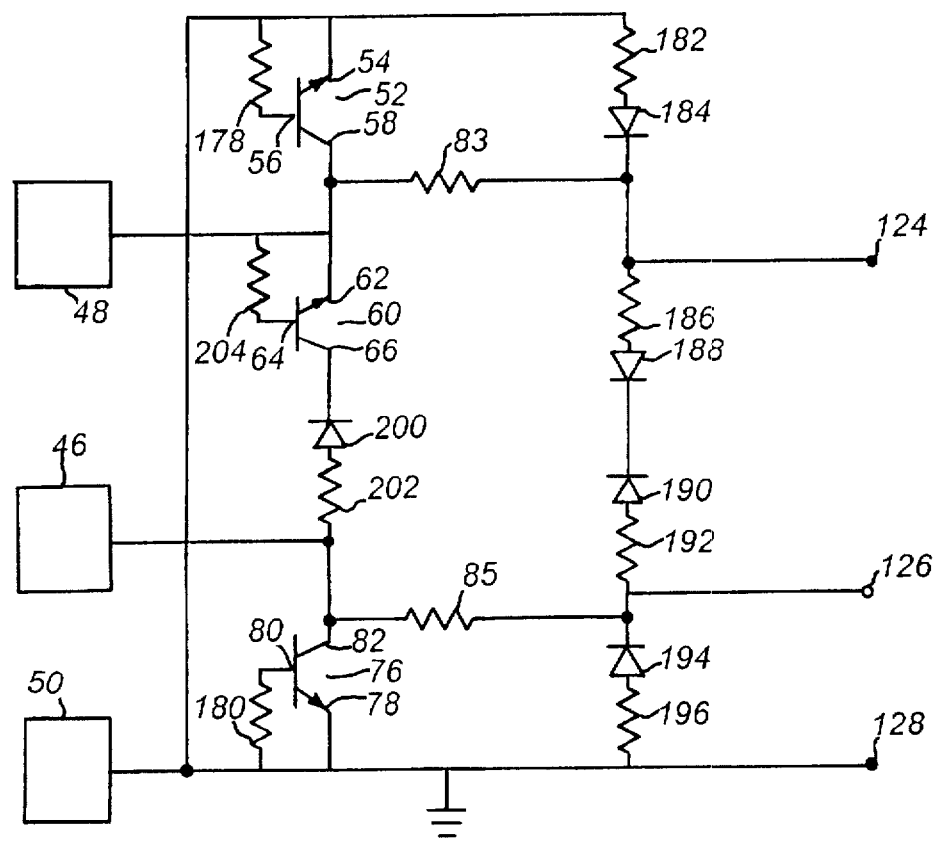
FIG. 5 is a schematic diagram of a first equivalent circuit of the first embodiment of the present invention.

FIG. 5 shows an approximately equivalent circuit (as verified by electrical microprobe analysis) of EOS/ESD protection circuit 42 of FIG. 2 during what is defined as the normal mode of operation of integrated circuit 40. In the normal mode of operation, the supply voltage connected to the first input reference voltage pad 48 is approximately five volts, the voltage at the ground reference is approximately zero volts and the voltage at the I/O pad is between zero and five volts. In FIG. 5, each of the PMOS transistors 84, 94, 104, and 114 of the ESD protection circuit 42 has been replaced by a respective reverse-biased diode 184, 188, 190 and 194, each of which is formed by the drain to back gate junction of each of the transistors, in series with a respective resistor 182, 186, 192 and 196 having substantially equal resistance values that are a function of the layout and sheet resistances of the layers of the integrated circuit 40.

In the equivalent circuit of FIG. 5, each of transistors 52, 68 and 76 has a respective resistor 178, 172 and 180 between its emitter and its base. These resistors are substantially equivalent and represent the effective base to emitter resistance which is a function of the layout and sheet resistances of the base and emitter diffusions of the transistors. Transistor 60 of FIG. 2 has been replaced in FIG. 5 by a forward biased diode 176, which is formed by the base to collector junction of transistor 60, in series with an associated resistor 174. The resistance value of resistor 174 is a function of the base and emitter diffusions of transistor 60.

During the normal mode of operation of the integrated circuit, in the absence of an EOS/ESD event, transistors 52, 68 and 76 will be off as the voltage from the collector to the emitter for each of the transistors is less than the collector to emitter breakdown voltage with the emitter shorted to the base ($BV_{CES}$). In a preferred embodiment of the present invention, the value of $BV_{CES}$ for each of transistors 52, 60, 68, and 76 is approximately 33 volts. Diodes 184, 190 and 194 are also off in the normal mode of operation as they are reversed biased with a voltage less than their reverse breakdown voltage. Each of diodes 176 and 188 is forward biased with a voltage greater than 0.6 volts and therefore is on. However, in the normal mode of operation, there is no appreciable current through either diode 176 or diode 188 since the corresponding serial elements, transistor 68 and diode 190, are off. Therefore, in the normal mode of operation, the EOS/ESD protection circuit 42 does not draw any appreciable current. The EOS/ESD protection circuit 42 does introduce a low impedance of approximately 153 ohms in the input path of the active circuit 44. In a preferred embodiment, the EOS/ESD protection circuit 42 is used to protect CMOS gates having a high input impedance, and the effect of the 153 ohm resistance is negligible. Accordingly, the EOS/ESD protection circuit 42 has negligible effects on the operation of the integrated circuit during the normal mode of operation in the absence of an EOS or ESD event.

Figure 6:
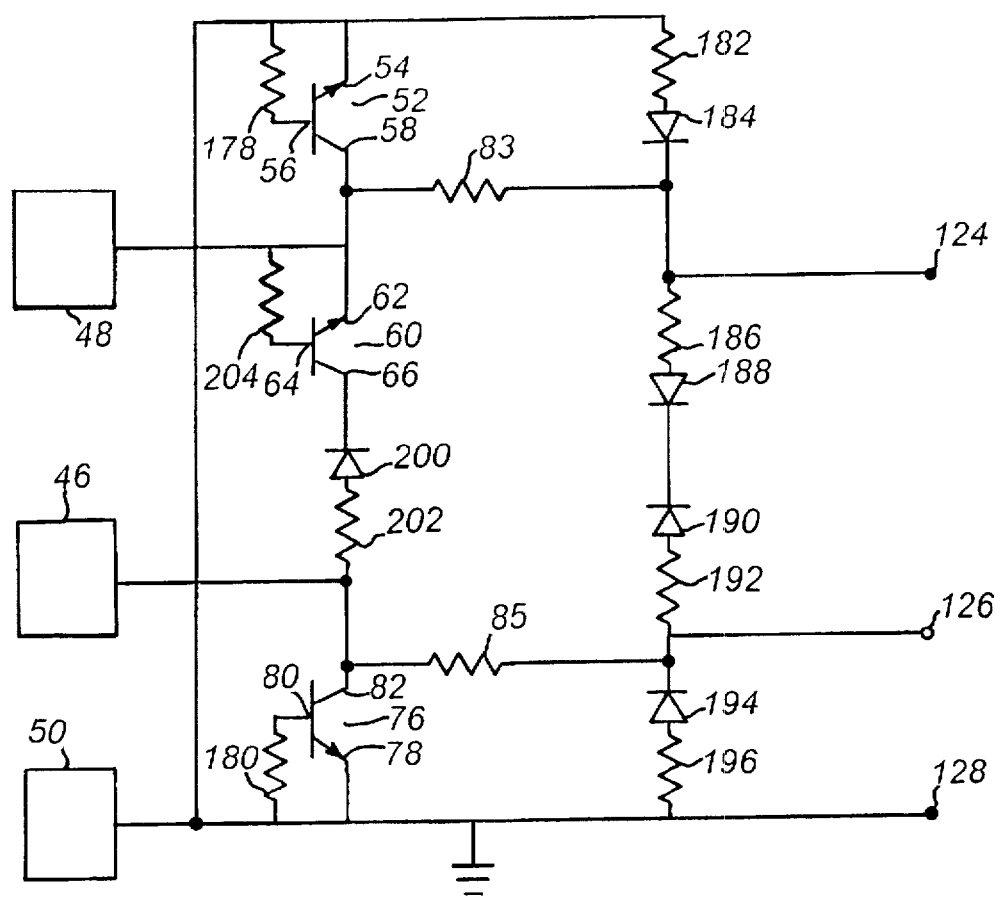
FIG. 6 is a schematic diagram of a second equivalent circuit of the first embodiment of the present invention.

FIG. 6 shows an approximately equivalent circuit (as verified by electrical microprobe analysis) of EOS/ESD protection circuit 42 of FIG. 2 during what is defined as the special mode of operation of integrated circuit 40. In the special mode of operation, the voltage of the voltage supply connected to the first input reference pad 48 is approximately five volts, the voltage at the ground reference is approximately zero volts and the voltage at the I/O pad 46 is between approximately 5.9 volts and ten volts. The only change of significance in the equivalent circuit of FIG. 6 over that of FIG. 5 is that the equivalent circuits of transistors 60 and 68 are interchanged. The equivalent circuit of transistor 60 in FIG. 6 includes the transistor 60 with a resistor 204 between its emitter 62 and its base 64. Resistor 204 is substantially equivalent to resistors 178 and 180 and is a function of the base and emitter diffusions of transistor 60. Transistor 68 of FIG. 2 is replaced in FIG. 6 by a diode 200 and a resistor 202 which are substantially equivalent to diode 176 and resistor 174 of FIG. 5.

The operation of the EOS/ESD protection circuit 42 of FIG. 2, as represented by its equivalent circuit of FIG. 6 during the special mode, in the absence of an EOS/ESD event, is similar to the operation during the normal mode described above. The only significant differences being that in the special mode of operation, diodes 190 and 200 are on, and transistor 60 and diode 188 are off. In the special mode of operation, as in the normal mode of operation, the ESD protection circuit has little or no effect on the operation of the integrated circuit 40 in the absence of an EOS or ESD event.

The operation of the EOS/ESD protection circuit 42 will now be described during EOS/ESD events. The first case to be considered is an EOS or ESD event at the I/O pad 46 having a positive polarity with respect to the first input reference voltage pad 48. Referring to FIG. 6, in a preferred embodiment of the present invention, the reverse breakdown voltage of each of diodes 184, 188, 190 and 194 is approximately 18 volts and the forward bias voltage is approximately 0.6 volts. Therefore, when the magnitude of the EOS or ESD transient voltage exceeds 18.6 volts, both diodes 190 and 188 will conduct current completing a discharge path through resistors 85, 192, 186, and 83 and the diodes 188 and 190.

Diodes 190 and 188 are protected from drawing excessive current (and the possibility of damage) by resistors 83 and 85. As the transient voltage rises, and the current through diodes 188 and 190 increases, the voltage drop across each of resistors 85, 192, 186 and 83 also increases. Once the magnitude of the sum of the voltage drops across the diode pair (approximately 18.6 volts) and the sum of the voltage drops across each of resistors 85, 192, 186 and 83 exceeds approximately 34 volts, current will flow through diode 200 and transistor 60. Under these conditions, diode 200 is forward biased with a voltage of 0.6 volts, and the base to collector junction of transistor 60 will exhibit an avalanche breakdown when the voltage across the junction exceeds approximately 33.4 volts.

As shown in FIG. 4, by arrow 170, the avalanche current through transistor 60 will initially primarily follow a path from the collector 70 through the base region 72 under the emitter region 74 to the conductor 140 connected to the base. As previously described, the region of the base diffusion layer 72 disposed under the emitter 74 is relatively resistive and the current following path 170 results in a voltage drop across the base diffusion layer 72. When the voltage drop under the emitter 74 exceeds approximately 0.6 volts, transistor 60 conducts current primarily in an active mode of operation. In a preferred embodiment of the present invention, the spacing between the base contact and the emitter contact is 6 µm (verses typical applications of 4.5 µm) triggering the onset of the active mode of conduction at a relatively low current. In the preferred embodiment of the present invention the required current to trigger the active mode has been measured to be approximately 10 milliamps.

The current path through transistor 60 during active mode is represented in FIG. 4, by arrow 172. In the active mode of transistor 60, electrons are emitted by the emitter 74, flow primarily vertically through the base/emitter junction, through the base region 72 to the buried layer 162, to the NPLUG 164 and out the collector 70. As understood by those skilled in the art, the direction of the current shown by arrow 172 is opposite that of the electron flow described above.

One of the primary benefits of the active mode of transistor 60 vs. the breakdown mode is a reduction in current density through the transistor. With prior art transistors and EOS/ESD protection schemes that rely primarily on lateral conduction (similar to current path 170 of FIG. 4), substantially all of the EOS/ESD current passes through the relatively shallow vertical sidewall of the base resulting in a high current density, excessive localized heating, and a high susceptibility to junction damage at relatively low EOS/ESD currents. In embodiments of the present invention, the current path 172 of the EOS/ESD current is vertical through the relatively large (5 µm by 20 µm) emitter diffusion area, resulting in much lower current densities in the transistor and therefore a higher robustness to junction damage.

A second benefit of embodiments of the present invention is a reduction in power dissipation in the transistor 60 due to an abrupt drop in voltage across the transistor at the onset of the active conduction mode. The initial breakdown voltage of transistor 60 (approximately 33 volts) drops to approximately 10 volts in the active mode. Thus, the instantaneous power dissipation of the transistor, which is equal to the product of the voltage and current at a given time, is substantially reduced in active mode.

The net effect of the ESD protection circuit 42 during an EOS or ESD event at the I/O pad 46 having a positive polarity with respect to the first input reference voltage pad 48 is that the EOS or ESD current is safely shunted away from the components of the active circuit 44. Diodes 188 and 190 limit the voltage at node 126 relative to node 124 to approximately 18.6 volts (the voltage drops across resistors 186 and 192 are negligible) which is below the breakdown voltage of internal gates or other dielectric layers of typical components of integrated circuits.

Once the EOS or ESD event passes, the voltage across resistor 204 drops below 0.6 volts, transistor 60 turns off, and after the transient voltage at I/O pad 46 drops below approximately 18.6 volts relative to the first input reference voltage pad 48, diodes 188 and 190 no longer conduct. The EOS/ESD protection circuit 42 then returns to its high impedance, low leakage current, inactive state.

Due to the symmetrical design of the EOS/ESD protection circuit 42, the operation of the protection circuit during an EOS or ESD event at the first input reference voltage pad 48 having a positive polarity with respect to the I/O pad 46 is substantially the same as the operation during an EOS or ESD event at the I/O pad having a positive voltage with respect to the first input reference voltage pad 48 described above. The only significant differences are that transistor 68 rather than transistor 60 will conduct current in an active mode, transistor 60 will act as a forward biased diode rather than transistor 68, and the voltage at node 126 relative to node 124 will be approximately negative 18.6 volts rather than positive 18.6 volts.

When an EOS or ESD event occurs at the first input reference voltage pad 48 having a positive polarity with respect to the second input reference voltage pad 50, the EOS/ESD protection circuit 42 protects the components of the active circuit 44 in a similar manner to that described above as follows with reference to FIG. 6. Diode 184 will exhibit a reverse breakdown and conduct the EOS/ESD current when the EOS/ESD transient voltage exceeds a level of approximately 18 volts creating an EOS/ESD discharge path through resistor 83, diode 184 and resistor 182. When the total voltage drop across resistors 83 and 182 and diode 184 exceeds approximately 33.4 volts, transistor 52 will exhibit breakdown and begin to conduct current. When the current through transistor 52 exceeds approximately 10 milliamps, transistor 52 will enter the active mode of operation and safely dissipate the EOS/ESD current at a relatively low voltage.

Once again due to the symmetry of the EOS/ESD protection circuit 42, the operation of the protection circuit during an EOS/ESD event at the I/O pad having a positive polarity with respect to the second input voltage reference pad 50 is substantially the same as the case described above for an EOS/ESD event at the first input reference voltage pad with respect to the second input reference voltage pad. The only significant difference is that diode 194, transistor 76, and resistors 85 and 196 will dissipate the transient rather than diode 184, transistor 52, and resistors 83 and 182.

During an EOS or ESD event at either the first input reference voltage pad 48 or the I/O pad 46 having a negative polarity with respect to the second input reference voltage pad 50, the discharge path of the EOS/ESD protection circuit does not include any avalanching junctions. For an EOS/ESD event at the I/O pad 46 having a negative polarity with respect to the second input reference pad 50, diode-connected transistors 76 and 114 of FIG. 2 will be forward biased and dissipate the EOS/ESD current. The EOS/ESD current through transistor 76 will be greater than through transistor 114 as the discharge path through transistor 114 includes the series resistor 83. Transistor 76, due to its relatively large size and the low instantaneous power dissipation associated with forward-biased conduction, can effectively dissipate relatively large EOS/ESD currents.

Similarly, for a negative EOS/ESD event at the first input reference voltage pad 48 with respect to the second input reference pad 50, transistors 52 and 84 will be forward biased and dissipate the EOS/ESD current.

ESD performance testing was conducted on three samples each of two different integrated circuits (IC1, IC2) incorporating the EOS/ESD protection device of the embodiment of the present invention shown in FIG. 2 on each I/O pin of the integrated circuits. The testing was conducted using a KeyTek Model 7/2 Zap/LatchMaster System manufactured by KeyTek Instrument Corp. of Wilmington, Mass. Testing was conducted in accordance with the ANSI/ESD Association Standard S5.1 Human Body Model (HBM), the ANSI/ESD Association Standard S5.2 Machine Model (MM) and the ANSI/ESD Association Draft Standard DS5.3 Socketed Charged Device Model (SCDM).

During the HBM and MM testing, each individual I/O pin of the integrated circuit under test was subjected to an electrostatic discharge stress sequence with respect to each individual supply pin as well as to a group of all other I/O pins of the integrated circuit. Each stress sequence consisted of three positive electrostatic discharges and three negative electrostatic discharges. The HBM testing was initiated with ESD amplitudes of 250 volts and increased in 250 volt increments, while the MM testing was initiated at an ESD amplitude of 25 volts and increased in 25 volt increments.

During SCDM testing, the substrate pins of the integrated circuit (corresponding to the ground pins) were used to charge the samples under test, and discharging was accomplished through each of the I/O pins of the integrated circuit that were protected by the EOS/ESD protection circuit shown in FIG. 2. For each discharging sequence, three positive and three negative ESD pulses were used. The SCDM testing was initiated with an ESD amplitude of 100 volts and was increased in 100 volt increments.

Failure criteria for the ESD testing was established as follows. The input current at each I/O pin of the integrated circuit under test was measured after each sequence of three stresses under two conditions: 1) with the input voltage at the I/O pin at 5.0 volts and with the supply voltage at 5.0 volts, and 2) with the input voltage at the I/O pin at 0.0 volts and the supply voltage at 5.0 volts. A failure was identified when the measured current exceeded 10 microamps. As an additional failure criteria, the input current was measured with an input voltage of 10 volts at each I/O pin to detect any ESD damage that could degrade the performance of the pins when operating in the special mode described previously. Again, a failure was identified when the measured current exceeded 10 microamps.

The test results are shown in Table 1. It should be noted that the maximum SCDM test capability of the test instrumentation used was 1500 volts so that the actual SCDM failure voltage was not established.

TABLE 1

| ESD TEST RESULTS | | | | |
|---|---|---|---|---|
| Integrated Circuit Under Test | Sample Size Per ESD Model | Lowest Pass Voltage HBM Test (volts) | Lowest Pass Voltage MM Test (volts) | Lowest Pass Voltage CDM Test (volts) |
| IC1 | 3 | ±2250 | ±275 | ±1500 |
| IC2 | 3 | ±2250 | ±275 | ±1500 |

All pins on each of the three samples of IC1 and IC2 were also tested for latch-up susceptibility using the test method outlined in Joint Electron Device Engineering Council (JEDEC) Standard Number 17 with the supply voltages for the integrated circuit under test set for a voltage of 7.0 volts. The testing was conducted initially with all input pins grounded and subsequently with all input pins set to 5.0 volts. Each of the input and output pins was tested using positive and negative current pulses having a 50 microsecond rise time, 10 millisecond duration, and an amplitude increased in ±50 milliamp increments from ±50 milliamps to ±300 milliamps. No latch-up conditions were detected.

In addition, testing in accordance with JEDEC Standard Number 17 was conducted on the positive supply pins of each integrated circuit using voltage pulses having a 50 microsecond rise time, 10 millisecond duration and an amplitude increased in 1 volt increments up to 15 volts. Also, testing was conducted on the ground pins using voltage pulses having a 50 microsecond rise time, a 10 millisecond duration and an amplitude increased in 1 volt increments from −2 volts to 2 volts. No latch-up conditions were detected during any of the tests.

Figure 7:
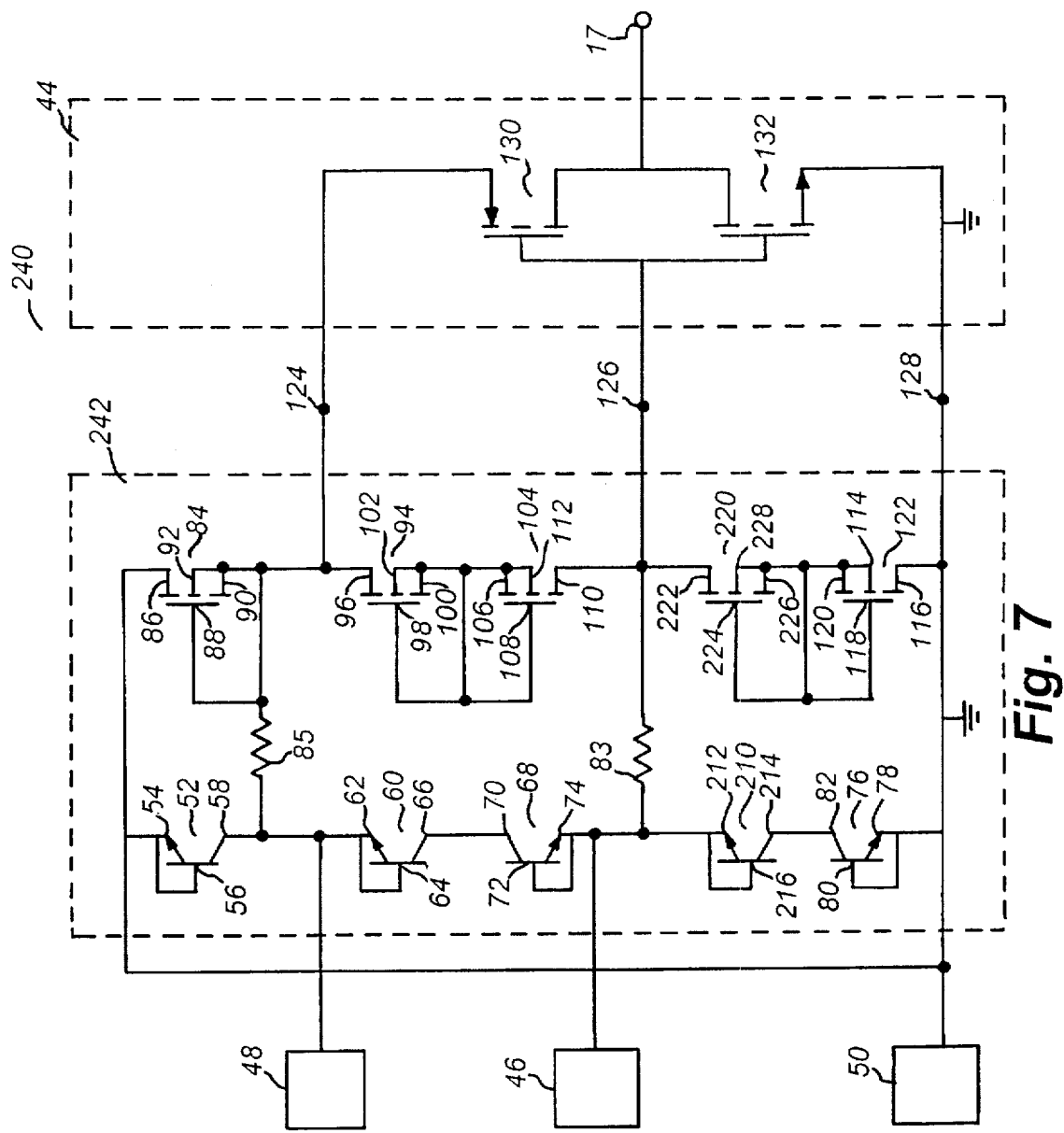
FIG. 7 is a schematic diagram of an EOS/ESD protection circuit in accordance with a second embodiment of the present invention.

Another embodiment of an integrated circuit 240 having an EOS/ESD protection circuit 242 and an active circuit 44 is shown in FIG. 7. In the integrated circuit 240, the voltage at the I/O pad 46 may exceed the voltage at the first reference pad 48 as in the previously described embodiment, and the voltage at the I/O pad 46 may also be substantially less than the voltage at the second voltage reference pad 50. In the embodiment shown in FIG. 7, the EOS/ESD protection circuit remains in an inactive state for voltages at the I/O pad 46 between approximately ±18.6 volts with respect to the voltage at either the first input reference pad 48 or the second input reference voltage pad 50. The EOS/ESD protection circuit 242 is useful in integrated circuits having operational modes in which the voltage at the I/O pad 46 may exceed the supply voltage of the integrated circuit or may be negative with respect to the ground reference of the circuit.

The EOS/ESD protection circuit 242 shown in FIG. 7 is similar to the EOS/ESD protection circuit 42 of FIG. 2 and similar components are labeled using the same reference numbers. The EOS/ESD protection circuit 242 includes all of the components of protection circuit 42 and an additional diode-connected vertical NPN transistor 210 and an additional diode-connected enhancement-mode PMOS transistor 220.

Transistor 210 is substantially identical to transistors 52, 60, 68 and 76 described earlier. The emitter 212 and base 216 of transistor 210 are connected together and connected to the I/O pad 46. The collector of transistor 210 is connected to the collector 82 of transistor 76. In a preferred embodiment of the present invention shown in FIG. 7, transistors 210 and 76 share a common collector (i.e., they are merged).

PMOS transistor 220 is substantially identical to PMOS transistors 84, 94, 104 and 114 described earlier. In transistor 220, as with transistors 84, 94, 104 and 114, source 226, gate 224 and back gate 228 are connected together. Source 228 of transistor 220 is also connected to source 120 of transistor 114. In a preferred embodiment of the present invention shown in FIG. 7, PMOS transistors 220 and 120 share a common source (i.e., they are merged). The drain of transistor 220 is connected to the I/O node 126.

The operation of the embodiment of the invention shown in FIG. 7 is essentially the same as the embodiment shown in FIG. 2. The primary difference in operation between the embodiment shown in FIG. 7 and that shown in FIG. 2 occurs when the voltage at the I/O pad 46 becomes negative with respect to the voltage at the second input reference pad 50. When the magnitude of the negative voltage at the I/O pad 46 with respect to the ground voltage at the second input reference pad exceeds approximately 0.6 volts, each of diode-connected transistors 76 and 114 becomes forward biased and turns on. Transistor 220 will turn on once the magnitude of the negative voltage at the I/O pad exceeds approximately 18.6 volts establishing a discharge path through transistors 114 and 220 and resistor 83. Similar to the previously described embodiments, once the total of the voltage drops across transistors 114 and 220 and resistor 83 exceeds approximately 34 volts, the reverse breakdown voltage of the base to collector junction of transistor 210 will be exceeded and transistor 210 will conduct current in reverse breakdown mode. Transistor 210 is of substantially identical construction to that of transistor 60 shown in FIGS. 3 and 4, and when the current through transistor 210 exceeds approximately 10 microamps, transistor 210 will be turned on in active mode and dissipate current from the second input reference pad 50 to the I/O pad 46 at a relatively low power level.

Figure 8:
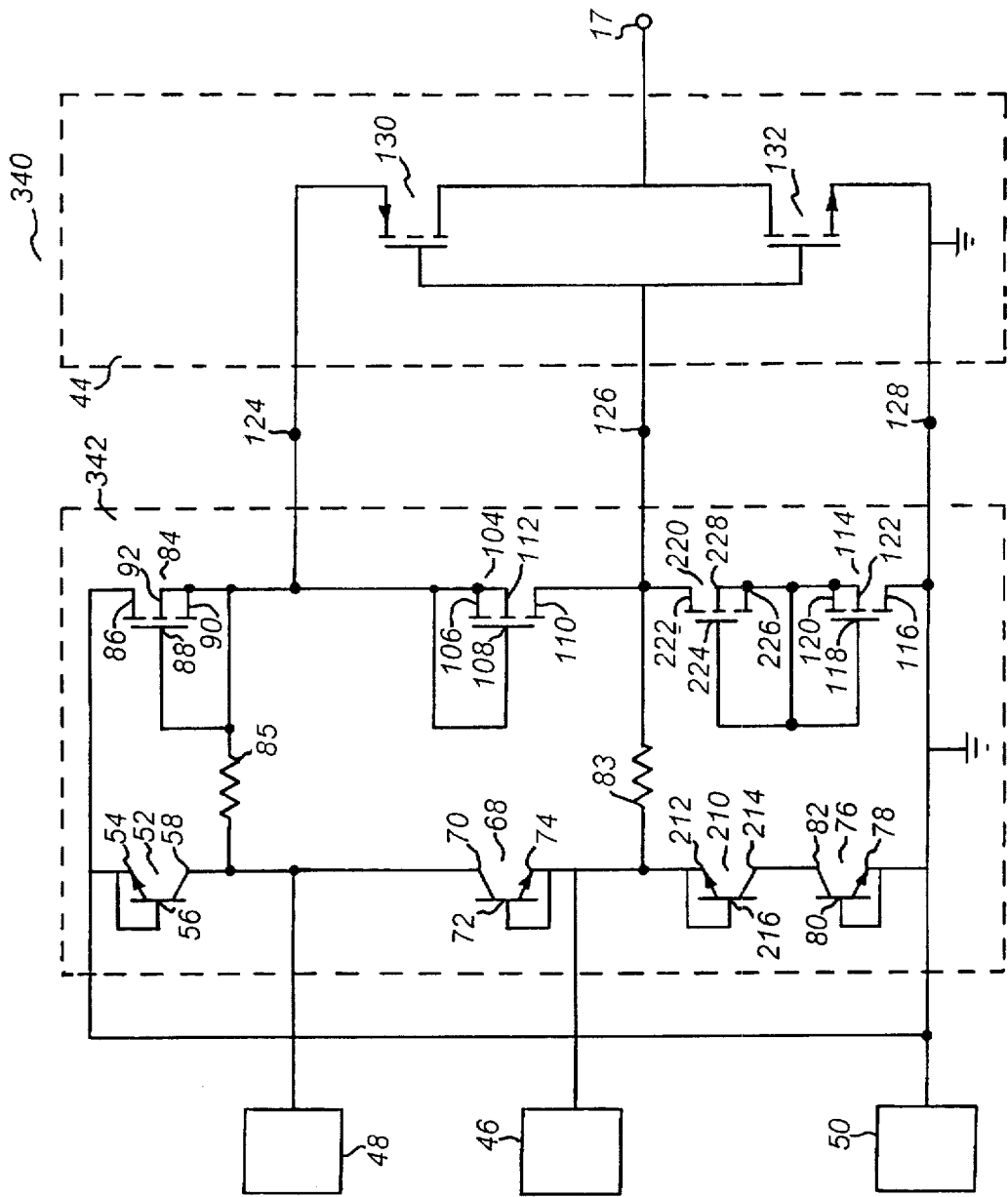
FIG. 8 is a schematic diagram of an EOS/ESD protection circuit in accordance with a third embodiment of the present invention.

Another embodiment of an integrated circuit 340 having an EOS/ESD protection circuit 342 and an active circuit 44 is shown in FIG. 8. In the integrated circuit 340, the voltage at the I/O pad 46 may be substantially less than the voltage at the second voltage reference pad 50. In the embodiment shown in FIG. 8, the EOS/ESD protection circuit remains in an inactive state for voltages at the I/O pad 46 as low as approximately 18.6 volts below the ground reference voltage at the second input reference voltage pad 50. The EOS/ESD protection circuit 342 of FIG. 8 is useful in applications where the integrated circuit has operational modes in which the voltage at the I/O pad may be negative with respect to a ground reference.

The EOS/ESD protection circuit 342 is similar to the EOS/ESD protection circuit 242 with the only significant differences being that transistors 60 and 94 of protection circuit 242 are not included in protection circuit 342. As understood by those skilled in the art, protection circuit 342 operates in a similar manner to protection circuit 242 with the exception that protection circuit 342 does not remain inactive for voltages at the I/O pad 46 in excess of the voltage at the first input reference pad 48 by more than approximately 0.6 volts.

Embodiments of the present invention overcome the limitations of the prior art discussed above. Specifically, embodiments of the present invention provide EOS/ESD protection circuits for integrated circuits having operational modes in which a voltage at an I/O pad may exceed a voltage at the voltage supply pad by more than two forward biased diode voltage drops, or in which the voltage at the I/O pad may be less than the voltage at a ground reference pad by more than two forward biased diode voltage drops. As demonstrated by test results on a preferred embodiment of the present invention, EOS/ESD protection circuits in accordance with embodiments of the present invention are not susceptible to latch-up conditions demonstrated by devices used in the prior art.

In embodiments of the present invention described above, EOS/ESD protection circuits have included diode-connected vertical NPN transistors and diode-connected PMOS transistors. As is understood by those skilled in the art, the diode-connected transistors may be replaced with diodes. However, if the diode-connected transistors designed to operate in active mode are replaced by diodes, the performance of the EOS/ESD protection circuit will be reduced.

The active circuit 44 of integrated circuits of embodiments of the present invention has been described as a CMOS inverter. EOS/ESD protection circuits in accordance with embodiments of the present invention are not limited to integrated circuits having CMOS inverters. The ESD protection circuits of embodiments of the present invention may be used in conjunction with circuits other than inverters and may be used on outputs of circuits as well as on inputs.

Having thus described at least one illustrative embodiment of the invention, various alterations, modifications and improvements will readily occur to those skilled in the art. Such alterations, modifications, and improvements are intended to be within the scope and spirit of the invention. Accordingly, the foregoing description is by way of example only and is not intended as limiting. The invention's limit is defined only in the claims and in the equivalents thereto.

What is claimed is:

1. An electrical overstress protection circuit for protecting an active circuit from electrical overstress, the electrical overstress protection circuit having first and second inputs for respectively receiving first and second reference voltages, first and second outputs for respectively providing the first and second reference voltages to the active circuit, first and second signal pads for respectively connecting to an external circuit and the active circuit, the electrical overstress protection circuit comprising:

first and second clamping circuits series connected between the first input and the first signal pad of the electrical overstress protection circuit, the first clamping circuit including a breakdown device that is constructed and arranged to conduct current in a first direction when a voltage across the breakdown device exceeds a forward conduction threshold, the second clamping circuit including a breakdown device constructed and arranged such that in a first direction of current through the breakdown device, the breakdown device has an active mode of operation and a breakdown mode of operation, the breakdown mode of operation occurring when a voltage across the breakdown device exceeds a reverse breakdown threshold, the breakdown device switching from breakdown mode to active mode when a magnitude of current through the breakdown device in the first direction exceeds a current threshold level; and third and fourth clamping circuits series connected between the first output and the second signal pad of the electrical overstress protection circuit.

2. The electrical overstress protection circuit of claim 1, wherein each of the third and fourth clamping circuits includes a MOS transistor.

3. The electrical overstress protection circuit of claim 1, wherein the breakdown device of the second clamping circuit conducts current in a second direction through the device when a voltage across the breakdown device exceeds a forward conduction threshold.

4. The electrical overstress protection circuit of claim 1, wherein the electrical overstress protection circuit is fabricated on a semiconductor substrate with the active circuit.

5. The electrical overstress protection circuit of claim 1, wherein a value of a voltage across the second clamping circuit in breakdown mode is greater than a value of the voltage across the second clamping circuit in active mode.

6. The electrical overstress protection circuit of claim 1, wherein the third and fourth clamping circuits have a combined breakdown voltage and wherein a first discharge current path is formed from the first input to the first signal pad of the protection circuit through the third and fourth clamping circuits when a voltage at the first input with respect to the first signal pad exceeds the combined breakdown voltage, a magnitude of the combined breakdown voltage of the third and fourth clamping circuits being less than a sum of the forward conduction threshold of the first clamping circuit and a magnitude of the reverse breakdown threshold of the second clamping circuit.

7. The electrical overstress protection circuit of claim 6, further comprising a first resistor disposed in the first discharge current path.

8. The electrical overstress protection circuit of claim 7, wherein the first resistor is connected between the first input of the electrical overstress protection circuit and the first output of the electrical overstress protection circuit, and wherein the electrical overstress protection circuit includes a second resistor disposed between the first signal pad and the second signal pad.

9. The electrical overstress protection circuit of claim 1, further comprising:

a fifth clamping circuit disposed between the first output of the electrical overstress protection circuit and the second output of the electrical overstress protection circuit, the fifth clamping circuit having a reverse breakdown threshold and a forward breakdown threshold and conducts current in a first direction when a voltage at the first output with respect to the second input exceeds the reverse breakdown threshold, and conducts current in a second direction when a voltage from the second output to the first output exceeds the forward conduction threshold; and a sixth clamping circuit disposed between the first input and the second input, the sixth clamping circuit having a breakdown device with a reverse breakdown voltage and having an active mode of operation and a breakdown mode of operation, the breakdown device operating in the breakdown mode of operation and conducts current in a first direction through the sixth clamping circuit when a voltage at the first input with respect to the second input exceeds the reverse breakdown voltage, the breakdown device switching from the breakdown mode of operation to the active mode of operation when a magnitude of a current through the clamping circuit in the first direction exceeds a current threshold level of the sixth clamping circuit.

10. The electrical overstress protection circuit of claim 9, wherein the breakdown device of the sixth clamping circuit has a forward conduction threshold and conducts current in a second direction through the clamping circuit when a voltage at the second input with respect to the first input exceeds the forward conduction threshold of the sixth clamping circuit.

11. The electrical overstress protection circuit of claim 10, further comprising:

a seventh clamping circuit disposed between the second signal pad of the electrical overstress protection circuit and the second input of the electrical overstress protection circuit, the seventh clamping circuit having a reverse breakdown threshold and a forward conduction threshold and conducts current in a first direction when a voltage across the seventh clamping circuit exceeds the reverse breakdown threshold, and conducts current in a second direction when a voltage across the seventh clamping circuit exceeds the forward conduction threshold; and an eighth clamping circuit disposed between the first signal pad and the second input, the eighth clamping circuit having a breakdown device with a reverse breakdown voltage and having an active mode of operation and a breakdown mode of operation, the breakdown device operating in the breakdown mode of operation and conducts current in a first direction through the eighth clamping circuit when a voltage across the eighth clamping circuit exceeds the reverse breakdown voltage, the breakdown device switching from the breakdown mode of operation to the active mode of operation when a magnitude of a current through the clamping circuit in the first direction exceeds a current threshold level of the eighth clamping circuit.

12. The electrical overstress protection circuit of claim 11, wherein the breakdown device of the eighth clamping circuit has a forward conduction threshold and conducts current in a second direction through the clamping circuit when a voltage across the eighth clamping circuit exceeds the forward conduction threshold of the eighth clamping circuit.

13. The electrical overstress protection circuit of claim 12, further comprising:

a ninth clamping circuit connected in series with the seventh clamping circuit between the second signal pad and the second output; and a tenth clamping circuit connected in series with the eighth clamping circuit between the first signal pad and the second input, said tenth clamping circuit including a breakdown device that in a first direction of current through the breakdown device has an active mode of operation and a breakdown mode of operation, the breakdown mode of operation occurring when a voltage across the breakdown device exceeds a reverse breakdown threshold, the breakdown device switching from the breakdown mode to the active mode when a magnitude of a current through the breakdown device in the first direction exceeds a current threshold level of the breakdown device.

14. The electrical overstress protection circuit of claim 13, wherein the breakdown device of each of the eighth and tenth clamping circuits is a bipolar transistor including a base having a resistance such that when the magnitude of the current is greater than the current threshold level through the breakdown device in breakdown mode, a voltage is created across the base triggering the bipolar transistor to switch from the breakdown mode to the active conduction mode.

15. The electrical overstress protection circuit of claim 1, wherein the breakdown device of the second clamping circuit is a bipolar transistor including a base having a resistance such that when the magnitude of current through the breakdown device in the first direction exceeds the current threshold level, a voltage is created across the base triggering the bipolar transistor to switch from the breakdown mode to the active mode.

16. The electrical overstress protection circuit of claim 15, wherein the bipolar transistor of the second clamping circuit is formed on a semiconductor substrate and includes:

a collector coupled to the first clamping circuit; and an emitter disposed between the collector and the base on the semiconductor substrate with a portion of the base being disposed underneath the emitter.

17. The electrical overstress protection circuit of claim 16, wherein the breakdown device of the first clamping circuit includes a bipolar transistor having a collector, an emitter and a base, wherein the collector is coupled to the collector of the bipolar transistor of the first clamping circuit and the base is connected to the emitter through a conductor.

18. The electrical overstress protection circuit of claim 1, wherein when current flows through the bipolar transistor of the first clamping circuit in a second direction, the first clamping circuit has an active mode of operation and a breakdown mode of operation, the breakdown mode of operation occurring when a voltage across the first clamping circuit exceeds a reverse breakdown threshold and the active mode of operation occurring when a magnitude of a current through the breakdown device in the second direction during the breakdown mode of operation exceeds a current threshold level, and wherein the base of the bipolar transistor of the first clamping circuit has a resistance such that when the magnitude of the current in the second direction through the breakdown device is greater than the current threshold level, a voltage is created across the base triggering the breakdown device to switch from the breakdown mode to the active mode.

19. The electrical overstress protection circuit of claim 17, wherein the breakdown device of the second clamping circuit conducts current in a second direction through the device when a voltage across the breakdown device exceeds a forward conduction breakdown threshold.

20. The electrical overstress protection circuit of claim 19, wherein the third and fourth clamping circuits have a reverse combined breakdown voltage and wherein a second discharge current path is formed from the first signal pad to the first input of the protection circuit through the third and fourth clamping circuits when a voltage at the first signal pad with respect to the first input exceeds the reverse combined breakdown voltage, a magnitude of the reverse combined breakdown voltage of the third and fourth clamping circuits being less than a sum of the forward conduction threshold of the second clamping circuit and a magnitude of the reverse breakdown threshold of the first clamping circuit, and the reverse combined threshold level being approximately equal to the combined threshold level.

21. The electrical overstress protection circuit of claim 17, wherein each of the third and fourth clamping circuits includes a MOS transistor.

22. The electrical overstress protection circuit of claim 21, wherein the third and fourth clamping circuits have a combined breakdown voltage and wherein a first discharge current path is formed from the first input to the first signal pad of the protection circuit through the third and fourth clamping circuits when a voltage at the first input with respect to the first signal pad exceeds the combined breakdown voltage, a magnitude of the combined breakdown voltage of the third and fourth clamping circuits being less than a sum of the forward conduction threshold of the first clamping circuit and a magnitude of the reverse breakdown threshold of the second clamping circuit.

23. The electrical overstress protection circuit of claim 22, further comprising a first resistor disposed in the first discharge current path.

24. The electrical overstress protection circuit of claim 23, wherein the first resistor is connected between the first input of the electrical overstress protection circuit and the first output of the electrical overstress protection circuit, and wherein the electrical overstress protection circuit includes a second resistor disposed between the first signal pad and the second signal pad.

25. The electrical overstress protection circuit of claim 24, wherein when current flows through the bipolar transistor of the first clamping circuit in a second direction, the first clamping circuit has an active mode of operation and a breakdown mode of operation, the breakdown mode of operation occurring when a voltage across the first clamping circuit exceeds a reverse breakdown threshold and the active mode of operation occurring when a magnitude of a current through the breakdown device in the second direction during the breakdown mode of operation exceeds a current threshold level, and wherein the base of the bipolar transistor of the first clamping circuit has a resistance such that when the magnitude of the current in the second direction through the breakdown device is greater than the current threshold level, a voltage is created across the base triggering the breakdown device to switch from the breakdown mode to the active mode.

26. The electrical overstress protection circuit of claim 25, wherein the breakdown device of the second clamping circuit conducts current in a second direction through the device when a voltage across the breakdown device exceeds a forward conduction threshold.

27. The electrical overstress protection circuit of claim 26, wherein the third and fourth clamping circuits have a reverse combined breakdown voltage and wherein a second discharge current path is formed from the first signal pad to the first input of the protection circuit through the third and fourth clamping circuits when a voltage at the first signal pad with respect to the first input exceeds the reverse combined breakdown voltage, a magnitude of the reverse combined breakdown voltage of the third and fourth clamping circuits being less than a sum of the forward conduction threshold of the second clamping circuit and a magnitude of the reverse breakdown threshold of the first clamping circuit, and the reverse combined threshold level being approximately equal to the combined threshold level.

28. The electrical overstress protection circuit of claim 27, further comprising:
   a fifth clamping circuit disposed between the first output of the electrical overstress protection circuit and the second output of the electrical overstress protection circuit, the fifth clamping circuit having a reverse breakdown threshold and a forward conduction threshold and conducts current in a first direction when a voltage at the first output with respect to the second input exceeds the reverse breakdown threshold, and conducts current in a second direction when a voltage at the second output with respect to the first output exceeds the forward conduction threshold; and
   a sixth clamping circuit disposed between the first input and the second input, the sixth clamping circuit having a breakdown device with a reverse breakdown voltage and having an active mode of operation and a breakdown mode of operation, the breakdown device operating in the breakdown mode of operation and conducts current in a first direction through the sixth clamping circuit when a voltage at the first input with respect to the second input exceeds the reverse breakdown voltage, the breakdown device switching from the breakdown mode of operation to the active mode of operation when a magnitude of current through the clamping circuit in the first direction exceeds a current threshold level of the sixth clamping circuit.

29. The electrical overstress protection circuit of claim 28, wherein the breakdown device of the sixth clamping circuit has a forward conduction threshold and conducts current in a second direction through the clamping circuit when a voltage at the second input with respect to the first input exceeds the forward conduction threshold of the sixth clamping circuit.

30. The electrical overstress protection circuit of claim 29, further comprising:
   a seventh clamping circuit disposed between the second signal pad of the electrical overstress protection circuit and the second input of the electrical overstress protection circuit, the seventh clamping circuit having a reverse breakdown threshold and a forward conduction threshold and conducts current in a first direction when a voltage across the seventh clamping circuit exceeds the reverse breakdown threshold, and conducts current in a second direction when a voltage across the seventh clamping circuit exceeds the forward conduction threshold; and
   an eighth clamping circuit disposed between the first signal pad and the second input, the eighth clamping circuit having a breakdown device with a reverse breakdown voltage and having an active mode of operation and a breakdown mode of operation, the breakdown device operating in the breakdown mode of operation and conducts current in a first direction through the eighth clamping circuit when a voltage across the eighth clamping circuit exceeds the reverse breakdown voltage, the breakdown device switching from the breakdown mode of operation to the active mode of operation when a magnitude of a current through the clamping circuit in the first direction exceeds a current threshold level of the eighth clamping circuit.

31. The electrical overstress protection circuit of claim 30, wherein the breakdown device of the eighth clamping circuit has a forward conduction threshold and conducts current in a second direction through the clamping circuit when a voltage across the eighth clamping circuit exceeds the forward conduction threshold of the eighth clamping circuit.

32. The electrical overstress protection circuit of claim 31, further comprising:
   a ninth clamping circuit connected in series with the seventh clamping circuit between the second signal pad and the second output; and
   a tenth clamping circuit connected in series with the eighth clamping circuit between the first signal pad and the second input, said tenth clamping circuit including a breakdown device that in a first direction of current through the breakdown device has an active mode of operation and a breakdown mode of operation, the breakdown mode of operation occurring when a voltage across the breakdown device exceeds a reverse breakdown threshold, the breakdown device switching from the breakdown mode to the active mode when a magnitude of a current through the breakdown device in the first direction exceeds a current threshold level of the breakdown device.

33. The electrical overstress protection circuit of claim 32, wherein the breakdown device of each of the eighth and tenth clamping circuits is a bipolar transistor including a base having a resistance such that when the magnitude of the current is greater than the current threshold level through the breakdown device in breakdown mode, a voltage is created across the base triggering the bipolar transistor to switch from the breakdown mode to the active conduction mode.

34. The electrical overstress protection circuit of claim 33, wherein the electrical overstress protection circuit is fabricated on a semiconductor substrate with the active circuit.

35. An electrical overstress protection circuit for protecting an active circuit from electrical overstress, the electrical overstress protection circuit comprising:
   first and second inputs for receiving first and second reference voltages of the active circuit;
   first and second outputs for providing the first and second reference voltages to the active circuit;
   first and second signal pads for respectively connecting to an external circuit and the active circuit; and
   first means for protecting the active circuit from an electrical overstress voltage at the first input having one of a positive or negative polarity with respect to the first signal pad, the first means for protecting having an off mode in which the first means for protecting has substantially no effect on the operation of the active circuit, and an on mode in which the first means for protecting limits an absolute value of a voltage at the first output with respect to the second signal pad to less than a predetermined clamping voltage value, the first means for protecting including switching means for switching from the off mode to the on mode when an absolute value of an electrical overstress voltage at the first input with respect to the first signal pad exceeds a first threshold value, the first threshold value being greater than the first reference voltage value by at least approximately two volts.

36. The electrical overstress protection circuit of claim 35, further comprising second means for protecting the active circuit from an electrical overstress voltage at the second input having one of a positive or negative polarity with respect to the first signal pad, the second means for protecting having an off mode in which the second means for protecting has substantially no effect on the operation of the active circuit, and an on mode in which the second means for protecting limits an absolute value of a voltage at the second output with respect to the second signal pad to less than a predetermined clamping voltage value, the second means for protecting including switching means for switching from the off mode to the on mode when an absolute value of an electrical overstress voltage at the second input with respect to the first signal pad exceeds a second threshold value, the second threshold value being greater than the second reference value by at least approximately two volts.

* * * * *